United States Patent
Kim et al.

(10) Patent No.: US 10,599,239 B2
(45) Date of Patent: Mar. 24, 2020

(54) ARRAY SUBSTRATE FOR TOUCH SENSOR IN-CELL TYPE DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Ji Sun Kim, Yongin-si (KR); Young Wan Seo, Yongin-si (KR); Yu Jin Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 352 days.

(21) Appl. No.: 15/239,719

(22) Filed: Aug. 17, 2016

(65) Prior Publication Data

US 2017/0060313 A1    Mar. 2, 2017

(30) Foreign Application Priority Data

Aug. 31, 2015    (KR) .................. 10-2015-0122881

(51) Int. Cl.
*G06F 3/041*    (2006.01)
*H01L 27/12*    (2006.01)
*G06F 3/044*    (2006.01)

(52) U.S. Cl.
CPC ............ *G06F 3/0412* (2013.01); *G06F 3/044* (2013.01); *H01L 27/124* (2013.01); *G06F 2203/04103* (2013.01)

(58) Field of Classification Search
CPC .......... G06F 2203/04112; G06F 3/044; G06F 3/0412; G06F 2203/04103; H01L 27/124
See application file for complete search history.

(56) References Cited

U.S. PATENT DOCUMENTS

| | | | |
|---|---|---|---|
| 9,317,152 B2 | 4/2016 | Pyo et al. | |
| 2011/0025969 A1* | 2/2011 | Chen | G02F 1/13338 349/139 |
| 2012/0162104 A1* | 6/2012 | Chang | G06F 3/0412 345/173 |
| 2014/0085267 A1* | 3/2014 | Ahn | G06F 3/0412 345/175 |
| 2014/0111471 A1 | 4/2014 | Zhao | |
| 2014/0139418 A1* | 5/2014 | Kim | G09G 3/3614 345/92 |
| 2016/0253010 A1* | 9/2016 | Xu | G02F 1/13338 349/12 |

FOREIGN PATENT DOCUMENTS

KR    10-2014-0032344 A    3/2014
KR    10-2014-0126287 A    10/2014

* cited by examiner

*Primary Examiner* — Yaron Cohen
(74) *Attorney, Agent, or Firm* — Innovation Counsel LLP

(57) ABSTRACT

An array substrate for a touch sensor in-cell type display device is disclosed. The array includes a base substrate, a plurality of pixels disposed on the base substrate and including a plurality of pixel rows and a plurality of pixel columns, a gate line extending in a first direction on the base substrate and disposed above and below in each pixel row, a data line extending in a second direction intersecting with the first direction on the base substrate and disposed in every two pixel columns, a touch sensing line extending in the second direction on the base substrate and parallel to the data line, a plurality of touch blocks provided by grouping the plurality of pixels by a predetermined number on the base substrate, and a common electrode disposed in each of the plurality of touch blocks.

10 Claims, 6 Drawing Sheets

ARRAY SUBSTRATE FOR TOUCH SENSOR IN-CELL TYPE DISPLAY DEVICE AND METHOD OF MANUFACTURING THE SAME

CROSS-REFERENCE TO RELATED APPLICATION

This application claims priority to and the benefit of Korean Patent Application No. 10-2015-0122881 filed on Aug. 31, 2015, in the Korean Intellectual Property Office, the disclosure of which is incorporated herein by reference in its entirety.

BACKGROUND

Field

An embodiment of the present disclosure relates to an array substrate for a touch sensor in-cell type display device and a method of manufacturing the same.

Description of Related Art

Electronic devices including a touch-sensitive screen are widely used. Examples of such electronic devices include a mobile device such as a smart phone, a laptop computer, and a tablet computer. To select a predetermined object or region displayed on a touch screen of an electronic device, a direct and selective touch input is provided onto a touch screen using a finger or a stylus pen.

A touch-type display device includes a touch panel for sensing a touch input that is attached to a display panel, and an in-cell structure in which a touch electrode and a wiring are formed on a substrate of the display panel to implement a single panel. In particular, a touch-type display device employing an in-cell structure has been highlighted for being able to provide a sensitive touch input and simplify manufacturing processes.

The touch-type display device includes a touch electrode and a touch wiring for sensing a touch input. Various studies have been conducted to reduce a manufacturing cost by simplifying manufacturing processes.

SUMMARY

An embodiment of the present disclosure relates to an array substrate for a touch sensor in-cell type display device and a method of manufacturing the same capable of simplifying manufacturing processes and reducing a manufacturing cost.

An array substrate for a touch sensor in-cell type display device according to an embodiment of the present disclosure may include a base substrate, a plurality of pixels disposed on the base substrate and including a plurality of pixel rows and a plurality of pixel columns, a gate line extending in a first direction on the base substrate and disposed above and below in each pixel row, a data line extending in a second direction intersecting with the first direction on the base substrate and disposed in every two pixel columns, a touch sensing line extending in the second direction on the base substrate and parallel to the data line, a plurality of touch blocks provided by grouping the plurality of pixels by a predetermined number on the base substrate, and a common electrode disposed in each of the plurality of touch blocks.

In the embodiment, the touch sensing line may be disposed in every two pixel columns.

In the embodiment, the data line and the touch sensing line may be separated from each other on the base substrate.

In the embodiment, the data line and the touch sensing line may be alternately disposed in the second direction on the base substrate.

In the embodiment, the touch sensing line may be connected to the common electrode and provided within any one of the plurality of touch blocks through a contact hole.

In the embodiment, the data line and the touch sensing line may comprise the same conductive material.

In the embodiment, the array substrate may further comprise a thin film transistor (TFT) connected to each of the gate line and the data line.

In the embodiment, the array substrate may further comprise a pixel electrode connected to the TFT.

In the embodiment, the touch sensing line may have a mesh structure on the base substrate.

A method for manufacturing an array substrate for a touch sensor in-cell type display device according to another embodiment of the present disclosure may include: forming a gate line extending in a first direction on a base substrate and a gate electrode extending from the gate line; forming a first insulating layer on the gate electrode and the gate line, forming a semiconductor pattern, a data line, a source electrode extending from the data line, a drain electrode spaced apart from the source electrode, and a touch sensing line parallel to the data line; forming a second insulating layer on the semiconductor pattern, the data line, the touch sensing line, the source electrode, and the drain electrode and having a first opening exposing a portion of the touch sensing line and a second opening exposing a portion of the drain electrode; forming a pixel electrode connected to the drain electrode on the second insulating layer; forming a third insulating layer on the pixel electrode and having a contact hole corresponding to the first opening of the second insulating layer; and forming a common electrode connected to the touch sensing line through the contact hole on the third insulating layer.

In the embodiment, the data line and the touch sensing line may be separated from each other on the base substrate.

In the embodiment, the data line and the touch sensing line may be disposed alternately in a second direction intersecting with the first direction on the base substrate.

In the embodiment, the data line and the touch sensing line may be formed on the same layer and include the same conductive material.

In the embodiment, the second insulating layer and the third insulating layer may comprise an organic insulating material.

In the embodiment, the touch sensing line may have a mesh structure on the base substrate.

According to the embodiment of the present disclosure, a touch sensing line may be formed between data lines without an additional process, the manufacturing processes may be simplified and a manufacturing cost may be reduced.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
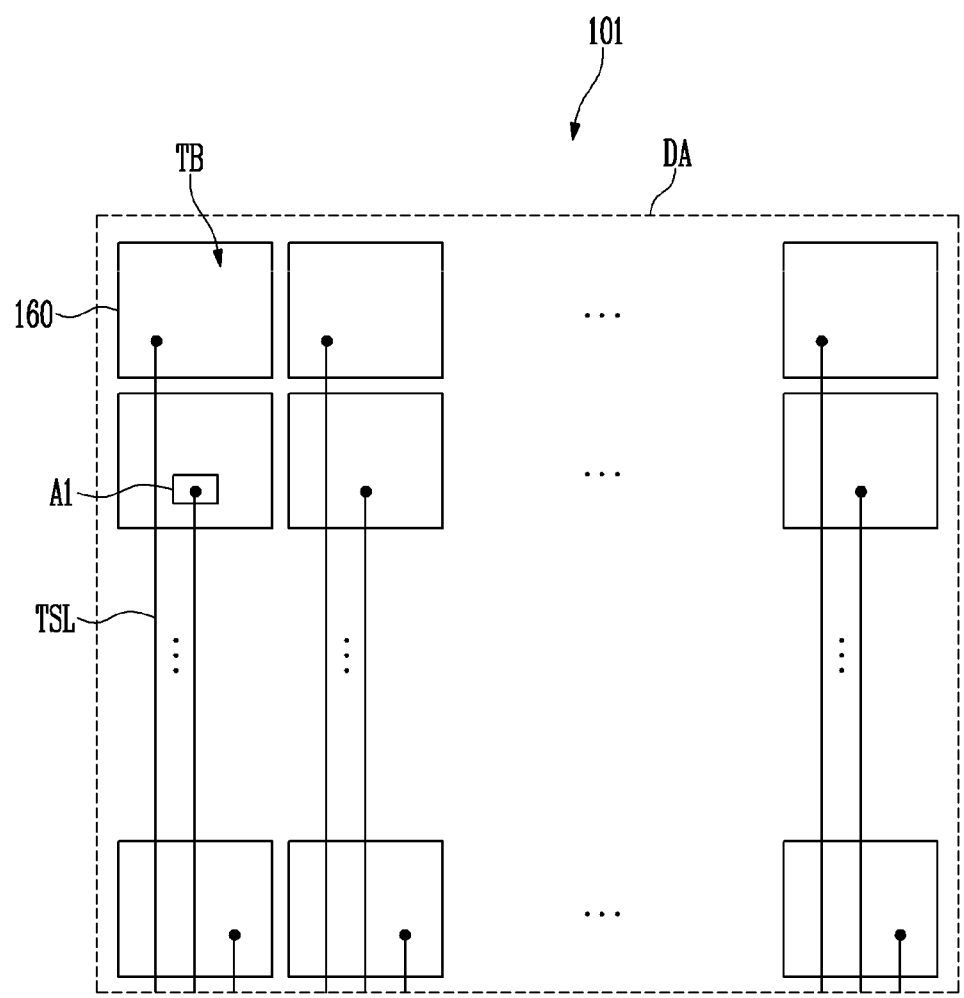
FIG. 1 is a plan view illustrating a portion of a display region of an array substrate for a touch sensor in-cell type display device, according to an embodiment of the present disclosure.

Details of embodiments are included in detailed descriptions and drawings. The advantages and features of the present disclosure and methods for achieving these will be clarified in detail through embodiments described hereinafter in conjunction with the accompanying drawings.

However, embodiments of the present disclosure may, however, be implemented in many different forms and should not be construed as being limited to the embodiments set forth herein. Rather, these embodiments are provided so that the present disclosure will be thorough and complete, and will fully convey the scope of the present disclosure to those skilled in the art. Throughout the specification, the same reference numerals will be used to designate the same or like components.

In order to clarify the present disclosure, parts that are not connected with the description may be omitted, and since sizes and thickness of respective components are arbitrarily shown for the description purpose, the present disclosure is not necessarily limited to the examples shown in the drawings.

In the drawings, the thickness of layers, films, regions, etc., may be exaggerated for clarity. In addition, in the drawings, the thickness of some layers and regions may be exaggerated for the sake of brevity. It will be understood that when an element such as a layer, film, region, or substrate is referred to as being "on" another element, it can be directly on the other element or one or more intervening elements may also be present.

Figure 2:
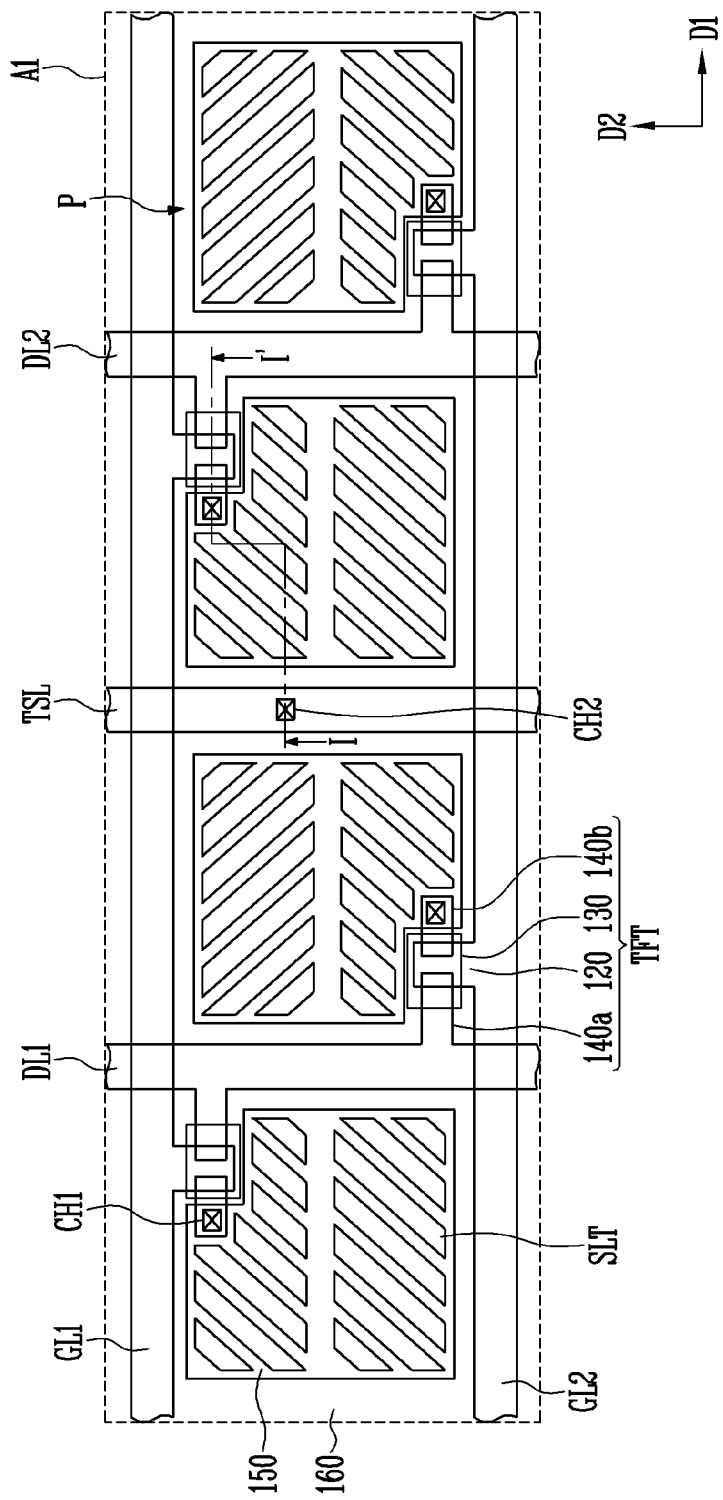
FIG. 2 is an enlarged view of a region "A1" of FIG. 1.
Figure 3:
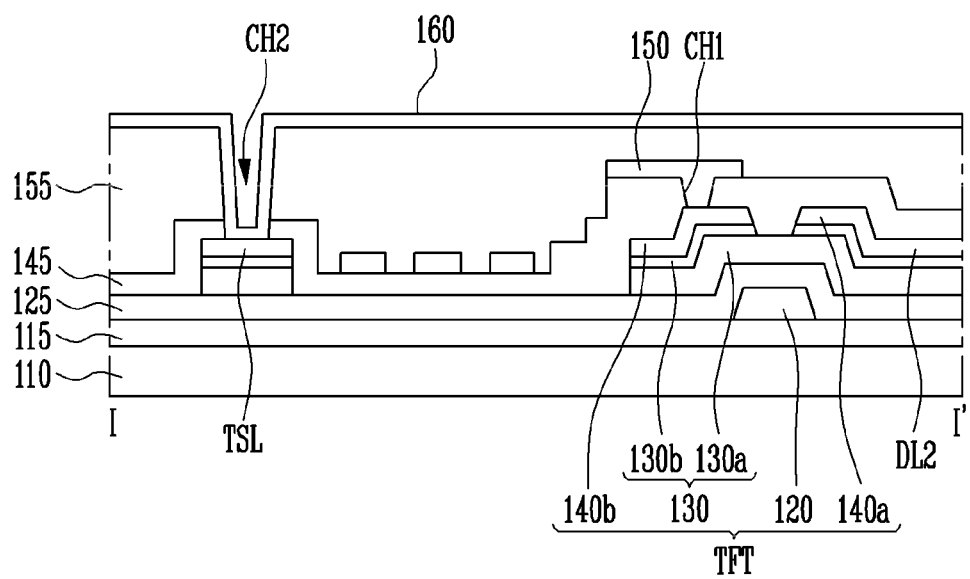
FIG. 3 is a cross-sectional view taken along line I-I' of FIG. 2.

FIG. 1 is a plan view illustrating a portion of a display region of an array substrate for a touch sensor in-cell type display device, according to an embodiment of the present disclosure. FIG. 2 is an enlarged view of a region "A1" of FIG. 1, and FIG. 3 is a cross-sectional view taken along line I-I' of FIG. 2. Hereinafter, an example of an array substrate for a touch sensor in-cell type display device according to an embodiment of the present disclosure will be described with reference to FIGS. 1 through 3.

Referring to FIGS. 1 through 3, an array substrate 101 for a touch sensor in-cell type display device (hereinafter, referred to as an "array substrate") according to an embodiment of the present disclosure includes a display area DA having a plurality of pixels P. The display area DA includes a touch block TB that includes a predetermined number of pixels P.

In the touch block TB, a common electrode 160 corresponds to each touch block TB. A touch sensing line TSL sensing a change in a load of capacitance when a touch is applied through the common electrode 160 and transferring the sensed change to a sensing circuit (not shown) is disposed below the common electrode 160. The common electrode 160 and the touch sensing line TSL separated by touch blocks TB are selectively connected. The touch sensing line TSL is electrically connected to the common electrode 160 through a second contact hole CH2.

The display device including the array substrate 101 displays an image by providing a common voltage to the common electrode 160 during a display period in which an image is displayed, and detects a touch position by providing a touch sensing voltage to the common electrode 160 during a non-display period in which an image is not displayed. That is, the common electrode 160 serves as an electrode for displaying an image and a touch electrode for detecting a touch input.

When a user touches the display area DA by using a finger or a stylus, touch capacitance is formed between a common electrode 160 and the corresponding touch block TB. The display device having the array substrate 101 compares the touch capacitance formed by the user's touch with a reference capacitance value to detect a touch position and performs an operation according to the detected touch position.

The display area DA includes gate lines GL1 and GL2, data lines DL1 and DL2, the touch sensing line TSL, and the plurality of pixels P formed on a base substrate 110. The plurality of pixels P may be arranged in a matrix form including a plurality of pixel columns and a plurality of pixels rows. Two pixels columns may be disposed between two adjacent data lines DL1 and DL2. The gate lines GL1 and GL2 may be disposed above and below one pixel row. The pixels of the pixel row may be electrically connected to the gate lines GL1 and GL2. In the plurality of pixels P, two pixel columns share one data line DL1 or DL2.

The gate lines GL1 and GL2 extend in a first direction D1 in the display area DA. The data lines DL1 and DL2 extend in a second direction D2 intersecting with the first direction D1. The touch sensing line TSL extends in a direction substantially the same as that of the data lines DL1 and DL2.

Each of the plurality of pixels P includes a thin film transistor TFT and a pixel electrode 150 connected to the TFT. The TFT includes a gate electrode 120, a semiconductor pattern 130, a source electrode 140a, and a drain electrode 140b. The gate electrode 120 is connected to corresponding gate lines GL1 and GL2, the source electrode 140a is connected to corresponding data lines DL1 and DL2, and the drain electrode 140b is connected to the pixel electrode 150. The gate electrode 120 protrudes from the gate lines GL1 and GL2 or is provided in a partial region of the gate lines GL1 and GL2. The source electrode 140a protrudes from the data lines DL1 and DL2 or is provided in a partial region of the data lines DL1 and DL2.

Hereinafter, the array substrate 101 according to an embodiment of the present disclosure will be described in a stacking order.

The array substrate 101 includes the base substrate 110 on which the TFT is formed. The base substrate 110 has a substantially quadrangular shape and is formed of a transparent insulating material.

A buffer layer 115 is provided on the base substrate 110. The buffer layer 115 prevents diffusion of an impurity to the TFT. The buffer layer 115 may be formed of a silicon nitride (SiNx), a silicon oxide (SiOx), or a silicon oxynitride (SiOxNy), and may be omitted according to materials and process conditions of the base substrate 110.

The gate lines GL1 and GL2 and the gate electrode 120 extending from the gate lines GL1 and GL2 are formed on the buffer layer 115. The gate lines GL1 and GL2 and the gate electrode 120 may be formed of a conductive material, for example, a metal. The gate lines GL1 and GL2 and the gate electrode 120 may be formed of a single metal, or may be formed of two or more types of metals or may be formed of an alloy of two or more types of metals. In addition, the gate lines GL1 and GL2 and the gate electrode 120 may be formed as a monolayer or multiple layers.

A first insulating layer 125 is provided on the gate lines GL1 and GL2 and the gate electrode 120. The first insulating layer 125 may be formed of an organic insulating material or an inorganic insulating material. For example, the first insulating layer 125 may be formed of a silicon oxide or a silicon nitride.

The semiconductor pattern 130 is formed on the first insulating layer 125. The semiconductor pattern 130 may include an active layer 130*a* and an ohmic contact layer 130*b* positioned on the active layer 130*a* and having an impurity injected thereto. The impurity may vary depending on the type of the TFT.

The data lines D1 and D2, the source electrode 140*a*, the drain electrode 140*b*, and the touch sensing line TSL are formed on the semiconductor pattern 130. In the semiconductor pattern 130, a region between the source electrode 140*a* and the drain electrode 140*b* may be a channel portion.

The source electrode 140*a* is directly provided on the semiconductor pattern 130 to cover a portion of a surface of the semiconductor pattern 130, and extends from the data lines DL1 and DL2. The drain electrode 140*b* is provided on the semiconductor pattern 130 and spaced apart from the source electrode 140*a*.

The data lines DL1 and DL2, the source electrode 140*a*, the drain electrode 140*b*, and the touch sensing line TSL may be formed of a conductive material, for example, a metal. The data lines DL1 and DL2, the source electrode 140*a*, the drain electrode 140*b*, and the touch sensing line TSL may be formed of a single metal, or may be formed of two or more types of metals or an ally of two or more types of metals. In addition, each of the data lines DL1 and DL2, the source electrode 140*a*, the drain electrode 140*b*, and the touch sensing line TSL may be formed as a monolayer or multiple layers.

A second insulating layer 145 is provided on the data lines DL1 and DL2, the source electrode 140*a*, the drain electrode 140*b*, and the touch sensing line TSL. The second insulating layer 145 may cover the TFT and include at least one layer. The second insulating layer 145 may include an organic insulating material that is transparent and flexible to alleviate an irregular portion of a lower structure to planarize a surface. The organic insulating material may include any one selected from a group including acryl resin, benzocyclobutane (BCB), polyimide (PI), polyamide (PA), and a phenol resin.

The pixel electrode 150 electrically connected to the drain electrode 140*b* through a first contact hole CH1 is provided on the second insulating layer 145. The pixel electrode 150 may be formed of a transparent conductive material. In particular, the pixel electrode 150 may be formed of a transparent conductive oxide. The transparent conductive oxide may include indium tin oxide (ITO), indium zinc oxide (IZO), or indium tin zinc oxide (ITZO).

A portion of the pixel electrode 150 may be removed to have a plurality of slits SLT. The slits SLT may be provided to be sloped in the first direction D1 or in the second direction D2. In addition, the pixel electrode 150 may have a plurality of regions including the slits SLT having different sloped directions. Here, the regions may be substantially axially symmetrical to a line traversing the pixel P or may be substantially point symmetrical with respect to any one point within the pixel P. In FIG. 2, it is illustrated that the slits SLT are substantially axially symmetrical to a virtual line traversing the pixel P in the first direction D1.

A third insulating layer 155 is provided on the pixel electrode 150. The third insulating layer 155 may be formed of an organic insulating material to enhance flexibility. The organic insulating material may include an acrylic polymer, an imide-based polymer, an arylether-based polymer, an amide-based polymer, or siloxane.

The common electrode 160 is provided on the third insulating layer 155. The common electrode 160 may be formed of a conductive metal oxide such as indium tin oxide (ITO), indium zinc oxide (IZO), or indium tin zinc oxide (ITZO).

During a display period, a common voltage is provided to the common electrode 160, and during a non-display period, a touch sensing voltage is provided to the common electrode 160. The common electrode 160 serves as an electrode for displaying an image and as a touch electrode for detecting a touch position.

In an embodiment of the present disclosure, it is described that the electrode positioned in the uppermost layer of the base substrate 110 is the common electrode 160 and the pixel electrode 150 is positioned below the common electrode 160 with the third insulating layer 155 being interposed therebetween. However, it is noted that this example is merely for the purpose of description, and the name or position of the electrodes may be interchanged. For example, the pixel electrode 150 and the common electrode 160 may be designated as a common electrode and a pixel electrode or as a first electrode and a second electrode, respectively.

A second contact hole CH2 exposing a portion of an upper surface of the touch sensing line TSL is provided in the second insulating layer 145 and the third insulating layer 155. The common electrode 160 is electrically connected to the touch sensing line TSL through the second contact hole CH2.

The touch sensing line TSL is positioned between the data lines DL1 and DL2 and is formed on the base substrate 110 such that it is parallel to the data lines DL1 and DL2. Thus, the touch sensing line TSL and the data lines DL1 and DL2 do not overlap each other. That is, the touch sensing line TSL and the data lines DL1 and DL2 may be separated from each other on the base substrate 110.

In addition, the touch sensing line TSL may be disposed in every two pixel columns on the base substrate 110 to be alternately disposed with the data lines DL1 and DL2. The touch sensing line TSL may be electrically connected to a common voltage line (not shown) of a closed-loop type disposed near the display area DA to form a mesh structure.

As described above, in the array substrate 101 according to an embodiment of the present disclosure, the data lines DL1 and DL2 and the touch sensing line TSL may be simultaneously formed to omit a mask process for the touch sensing line TSL. Thus, the array substrate 101 according to an embodiment of the present disclosure may reduce the number of masks to simplify manufacturing processes and a manufacturing cost.

Further, in the array substrate 101 according to an embodiment of the present disclosure, the touch sensing line TSL that forms a mesh structure below the common electrode 160 is connected to the blocked common electrode 160 through the second contact hole CH2. Therefore, the resistance of the common electrode 160 may be reduced.

Hereinafter, a method for manufacturing an array substrate for a touch sensor in-cell type display device according to an embodiment of the present disclosure will be described in detail. FIGS. 4 through 10 are cross-sectional views illustrating a process of manufacturing an array substrate for a touch sensor in-cell type display device according to an embodiment of the present disclosure.

Figure 4:
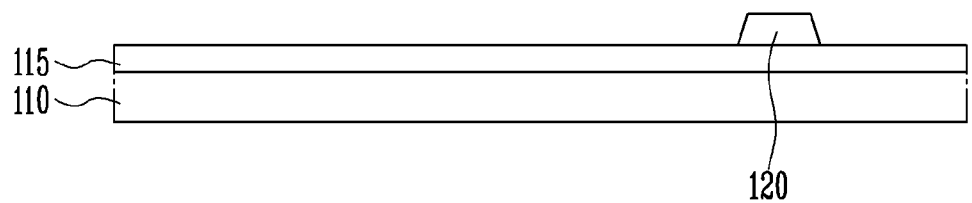
FIGS. 4 to 10 are cross-sectional views illustrating a process of manufacturing an array substrate for a touch sensor in-cell type display device, according to an embodiment of the present disclosure.

Referring to FIG. 4, a buffer layer 115 is formed on a base substrate 110 and a gate electrode 120 is formed on the buffer layer 115. The base substrate 110 may be selectively formed of a material having excellent mechanical strength or dimensional stability as a material for forming an element. The base substrate 110 may be formed of a glass plate, a metal plate, a ceramic plate, or a plastic (a polycarbonate resin, an acrylic resin, a vinyl chloride resin, a polyethyleneterephthalate resin, a polyimide resin, a polyester resin, an epoxy resin, a silicon resin, or a fluoride resin) plate.

The buffer layer 115 may be formed to protect a driving element, for example, a TFT, formed in a subsequent process from an impurity such as alkali ion discharged from the base substrate 110. The buffer layer 115 may be formed of a silicon nitride (SiNx), a silicon oxide (SiOx), or a silicon oxynitride (SiOxNy), and may be omitted according to a material choice of the base substrate 110.

The gate electrode 120 may be formed of a single type of metal or several types of metals, or an alloy thereof. In detail, the gate electrode 120 may be formed of a monolayer with a material selected from a group including molybdenum (Mo), tungsten (W), aluminum neodymium (AlNd), titanium (Ti), aluminum (Al), and silver (Ag), or an alloy thereof. In order to reduce wiring resistance, the gate electrode 120 may be formed as a dual layer or a multi-layer structure including two or more of molybdenum (MO), aluminum (Al), and silver (Ag).

Figure 5:
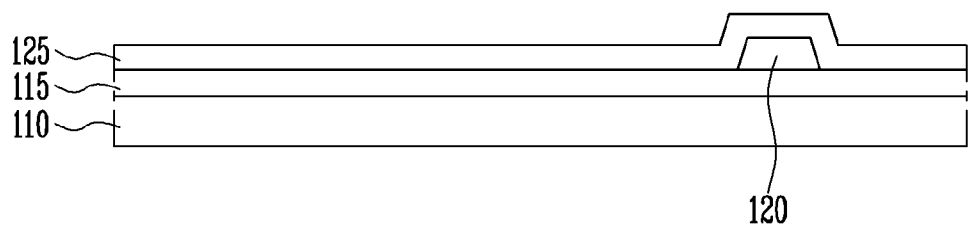

Referring to FIG. 5, a first insulating layer 125 is formed on the gate electrode 120. The first insulating layer 125 may include an inorganic insulating material formed as a monolayer film including a silicon nitride (SiOx), a silicon oxide (SiOx), or a silicon oxynitride (SiOxNy), or as a stacked film including two or more types of films selected from a group including a silicon nitride (SiNx), a silicon oxide (SiOx), and a silicon oxynitride (SiOxNy).

Figure 6:
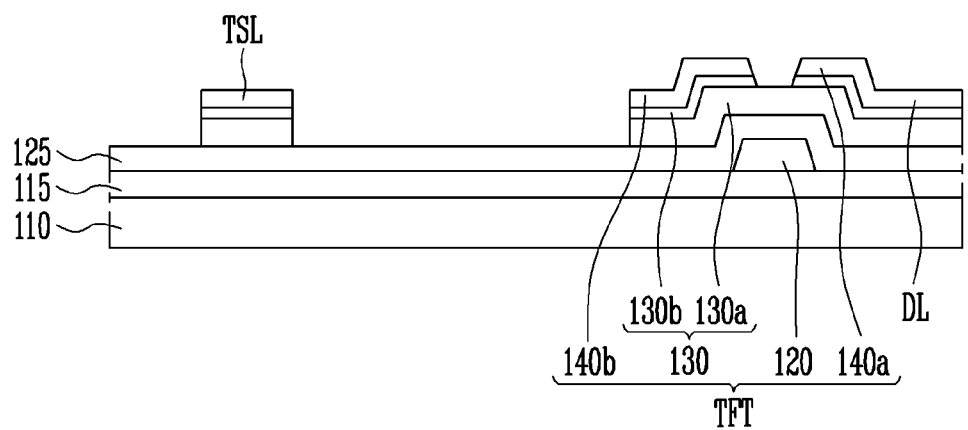

Referring to FIG. 6, a semiconductor pattern 130, a data line DL, a source electrode 140a, a drain electrode 140b, and a touch sensing electrode TSL are formed on the first insulating layer 125. The semiconductor pattern 130 may include an active layer 130a in which an impurity is not injected, and an ohmic contact layer 130b disposed on the active layer 130a and having an impurity injected thereto. The semiconductor pattern 130 may be provided in the form of a thin film on the first insulating layer 125. The semiconductor pattern 130 may be provided on the gate electrode 120, and may be formed to overlap at least a portion of the gate electrode 120 in a plan view.

The source electrode 140a, the drain electrode 140b, the data line DL, and the touch sensing line TSL may be formed of a conductive material, for example, a metal. The source electrode 140a, the drain electrode 140b, the data line DL, and the touch sensing line TSL may be formed of a single metal or may be formed of two or more types of metals or an ally of two or more types of metals. In addition, each of the source electrode 140a, the drain electrode 140b, the data line DL, and the touch sensing line TSL may be formed as a monolayer or a multi-layer.

The touch sensing line TSL is disposed to be parallel to the data line DL on the base substrate 110. Thus, the data line DL and the touch sensing line TSL are alternately disposed.

Figure 7:
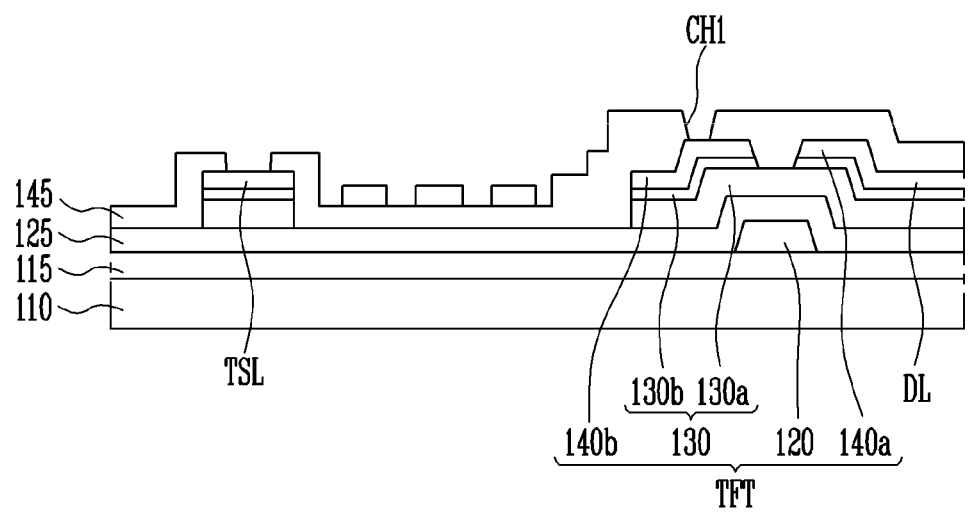

Referring to FIG. 7, a second insulating layer 145 including an insulating material is formed on the base substrate 110 on which the source electrode 140a, the drain electrode 140b, the data line DL, and the touch sensing line TSL are formed. The second insulating layer 145 includes an opening exposing a portion of the drain electrode 140b and a portion of the touch sensing line TSL using a photolithography process. For the purpose of explanation, the opening exposing a portion of the drain electrode 140b may be designated as a first contact hole CH1.

Figure 8:
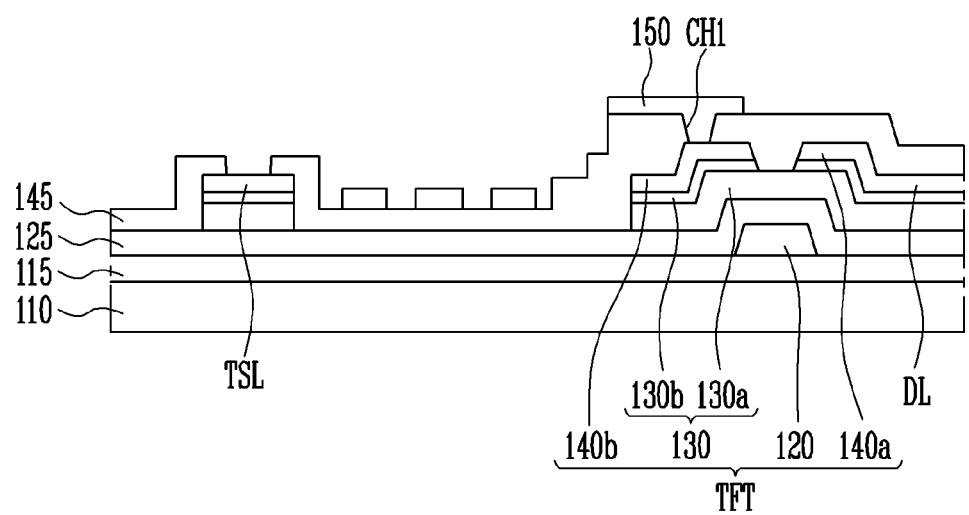

Referring to FIG. 8, a pixel electrode 150 is formed on the base substrate 110 on which the second insulating layer 145 is formed. The pixel electrode 150 may be formed by forming a conductive layer with a conductive material and subsequently patterning the conductive layer by using a photolithography process. The pixel electrode 150 may be formed of a transparent conductive material. In particular, the pixel electrode 150 may be formed of a transparent conductive oxide. The transparent conductive oxide may include indium tin oxide (ITO), indium zinc oxide (IZO), and indium tin zinc oxide (ITZO).

Figure 9:
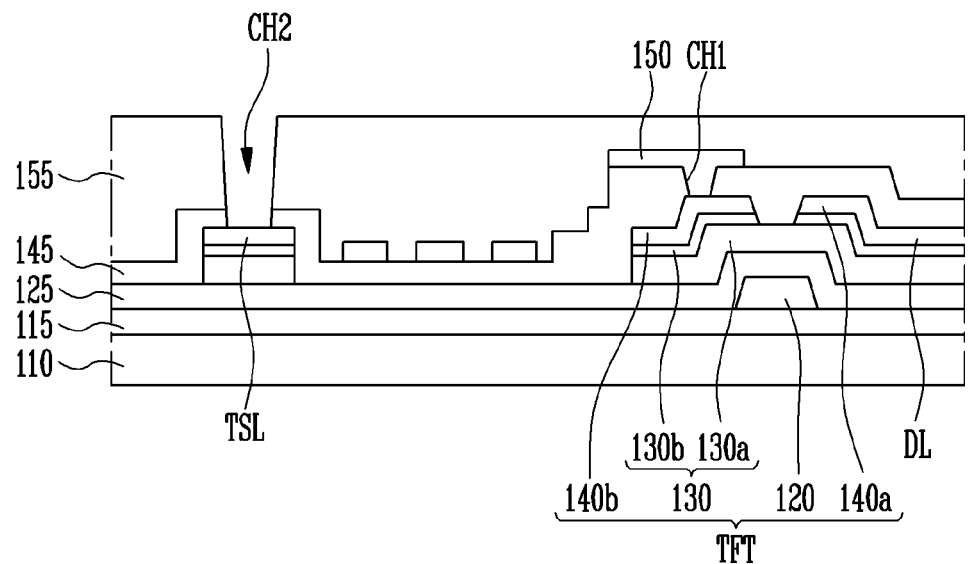

Referring to FIG. 9, a third insulating layer 155 is formed on the entire surface of the base substrate 110 on which the pixel electrode 150 is formed. The third insulating layer 155 may be formed of an organic insulating material that is transparent and flexible to alleviate an uneven pattern of a lower structure to planarize the surface. The third insulating layer 155 may include an opening corresponding to the second insulating layer 145 exposing a portion of the surface of the touch sensing line TSL. The opening of the second insulating layer 145 and the opening of the third insulating layer 155 may be designated as second contact holes CH2 exposing the touch sensing line TSL to the outside.

Figure 10:
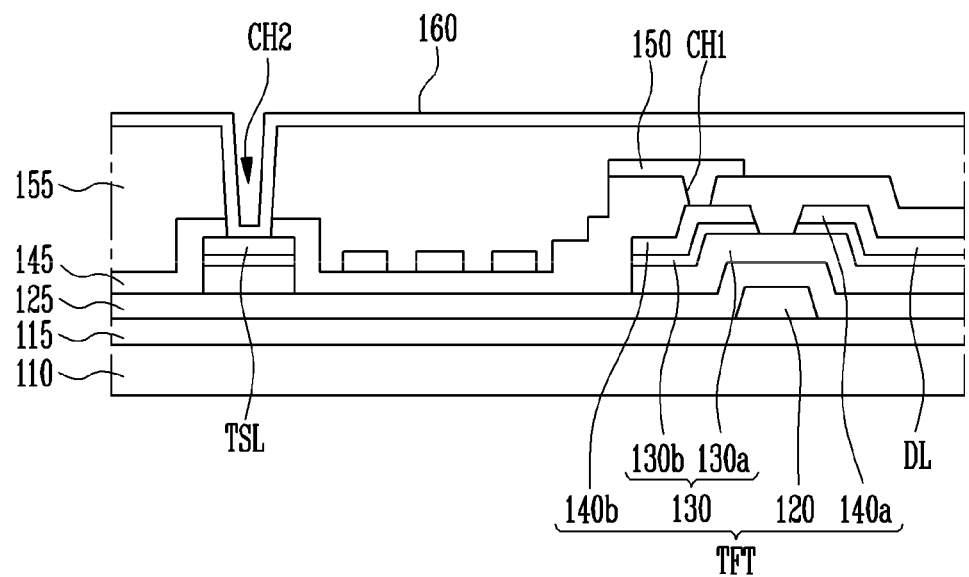

Referring to FIG. 10, a common electrode 160 is formed on the entire surface of the base substrate 110. The common electrode 160 may be formed of a transparent conductive material. The common electrode 160 may be formed of a conductive metal oxide such as indium tin oxide (ITO), indium zinc oxide (IZO), or indium tin zinc oxide (ITZO).

In the array substrate for a touch sensor in-cell type display device having the aforementioned structure according to an embodiment of the present disclosure, the data line DL and the touch sensing line TSL are simultaneously formed, therefore a mask process for forming the touch sensing line TSL may be omitted to reduce a manufacturing cost. In addition, the touch sensing line TSL has a mesh structure and is electrically connected to the blocked common electrode 160 through the second contact hole CH2, therefore the resistance of the common electrode 160 may be reduced.

Example embodiments have been disclosed herein. Although specific terms are employed, they are used and are to be interpreted in a generic and descriptive sense and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure.

What is claimed is:
1. An array substrate for a touch sensor in-cell type display device comprising:
a base substrate;
a plurality of pixels disposed on the base substrate and including a plurality of pixel rows and a plurality of pixel columns;

a gate line extending in a first direction on the base substrate and disposed above and below in each pixel row;

a data line extending in a second direction intersecting with the first direction on the base substrate and disposed in every two pixel columns;

a touch sensing line extending in the second direction on the base substrate and disposed in every two pixel columns parallel to the data line between adjacent data lines;

a plurality of touch blocks provided by grouping the plurality of pixels by a predetermined number on the base substrate; and a plurality of common electrodes, wherein each common electrode of the plurality of common electrodes is disposed to overlap the predetermined number of pixels corresponding to a respective one of the plurality of touch blocks to display an image by providing a common voltage and serves as a touch electrode for detecting a touch input based on a change of a capacitance between the common electrode and the corresponding touch block.

2. The array substrate of claim 1, wherein the data line and the touch sensing line are separated from each other on the base substrate.

3. The array substrate of claim 1, wherein the data line and the touch sensing line are alternately disposed in the second direction on the base substrate.

4. The array substrate of claim 1, wherein the common electrode is disposed on the touch sensing line with a first insulating layer and a second insulating layer including at least one contact hole interposed therebetween, and wherein the touch sensing line is electrically connected to the common electrode provided within any one of the plurality of touch blocks through the at least one contact hole.

5. The array substrate of claim 1, wherein the data line and the touch sensing line comprise the same conductive material.

6. The array substrate of claim 4, further comprising a thin film transistor (TFT) connected to each of the gate line and the data line.

7. The array substrate of claim 6, further comprising a pixel electrode connected to the TFT.

8. The array substrate of claim 1, wherein the touch sensing line has a mesh structure on the base substrate.

9. The array substrate of claim 7, wherein the common electrode is disposed on the pixel electrode with the second insulating layer interposed therebetween.

10. The array substrate of claim 9, wherein the common electrode and the pixel electrode are commonly provided on the base substrate.

* * * * *